(12) United States Patent
Röhrer et al.

(10) Patent No.: US 11,322,641 B2
(45) Date of Patent: May 3, 2022

(54) SEMICONDUCTOR DEVICE WITH SINGLE ELECTRON COUNTING CAPABILITY

(71) Applicant: ams AG, Premstaetten (AT)

(72) Inventors: Georg Röhrer, Premstaetten (AT); Robert Kappel, Premstaetten (AT); Nenad Lilic, Premstaetten (AT)

(73) Assignee: AMS AG, Premstaetten (AT)

( * ) Notice: Subject to any disclaimer, the term of this patent is extended or adjusted under 35 U.S.C. 154(b) by 73 days.

(21) Appl. No.: 16/631,791

(22) PCT Filed: Jul. 18, 2018

(86) PCT No.: PCT/EP2018/069551
§ 371 (c)(1),
(2) Date: Jan. 16, 2020

(87) PCT Pub. No.: WO2019/020471
PCT Pub. Date: Jan. 31, 2019

(65) Prior Publication Data
US 2020/0212245 A1    Jul. 2, 2020

(30) Foreign Application Priority Data
Jul. 26, 2017    (EP) .................................... 17183332

(51) Int. Cl.
*H01L 31/107*    (2006.01)
*H01L 31/11*    (2006.01)
*H01L 31/02*    (2006.01)

(52) U.S. Cl.
CPC .... *H01L 31/1105* (2013.01); *H01L 31/02027* (2013.01)

(58) Field of Classification Search
CPC ........... H01L 31/1105; H01L 31/02027; H01L 29/66159; H01L 29/864; H01L 29/66113; H01L 31/107; H01L 29/6603; H01L 29/6606; H01L 29/66204
USPC ........................................................ 257/438
See application file for complete search history.

(56) References Cited

U.S. PATENT DOCUMENTS

| 3,821,657 A | 6/1974 | Yu et al. |
| 4,975,751 A | 12/1990 | Beasom |
| 5,609,059 A * | 3/1997 | McEwan ............... G01F 23/284 342/124 |
| 2008/0150069 A1 | 6/2008 | Popovic et al. |
| 2010/0013458 A1* | 1/2010 | Lany ................... H01L 29/0821 324/123 R |

(Continued)

FOREIGN PATENT DOCUMENTS

EP    3081963    10/2016

OTHER PUBLICATIONS

European Patent Office, International Search Report for PCT/EP2018/069551 dated Sep. 28, 2018.
(Continued)

*Primary Examiner* — Calvin Y Choi
(74) *Attorney, Agent, or Firm* — MH2 Technology Law Group LLP

(57) ABSTRACT

The semiconductor device comprises a bipolar transistor with emitter, base and collector, a current or voltage source electrically connected with the emitter, and a quenching component electrically connected with the collector, the bipolar transistor being configured for operation at a collector-to-base voltage above the breakdown voltage.

14 Claims, 5 Drawing Sheets

(56) References Cited

U.S. PATENT DOCUMENTS

2014/0231630 A1    8/2014  Rae et al.

OTHER PUBLICATIONS

Henderson, R. K. et al.: "A Gate Modulated Avalanche Bipolar Transistor in 130nm CMOS Technology" Solid-State Device Research Conference (ESSDERC); IEEE; Sep. 17, 2012; p. 226-229.
Webster, E. A. G. et al.: "A single electron bipolar avalanche transistor implemented in 90nm CMOS" Solid-State Electronics, vol. 76; Oct. 1, 2012; p. 116-118.

\* cited by examiner

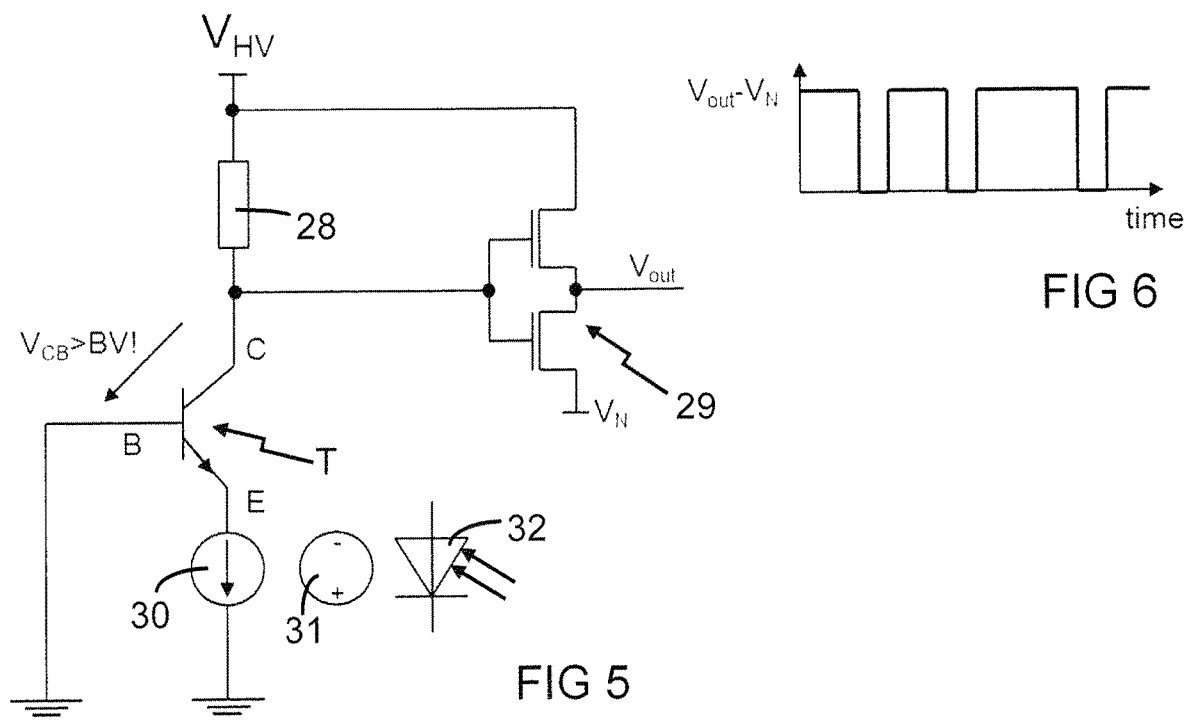
FIG 5
FIG 6
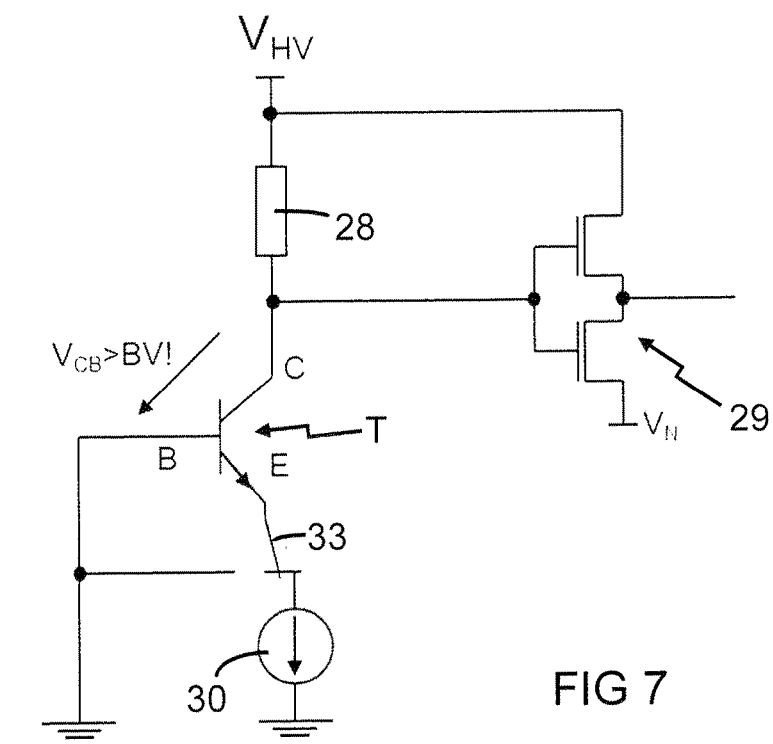
FIG 7

SEMICONDUCTOR DEVICE WITH SINGLE ELECTRON COUNTING CAPABILITY

The present disclosure is related to semiconductor devices for the measurement of small currents or voltages.

BACKGROUND OF THE INVENTION

Single-photon avalanche diodes (SPADs) are semiconductor devices with a p-n junction. A reverse bias is used to increase the width of the depletion region. When the operating voltage providing the reverse bias exceeds the breakdown voltage of the p-n junction by the so-called excess bias voltage, a single charge carrier injected into the depletion layer triggers a self-sustaining avalanche. The current rises swiftly unless the operating voltage is decreased to the breakdown voltage or below. The avalanche is initiated from pairs of electrons and holes, which are generated by photons from a light source or by a forward biased p-n junction.

SUMMARY OF THE INVENTION

The definitions as described above also apply to the following description unless stated otherwise.

The semiconductor device with single electron counting capability comprises a bipolar transistor with emitter, base and collector, a current or voltage source electrically connected with the emitter, and a quenching component electrically connected with the collector. The bipolar transistor is configured for operation at a reverse collector-to-base voltage above the collector-to-base breakdown voltage.

In particular, the bipolar transistor is a vertical bipolar transistor. During operation of a vertical bipolar transistor, electric current across the base region flows in the direction normal to the main surface of the semiconductor substrate or wafer of the device. The current flow may additionally have a lateral component parallel to the main surface.

In an embodiment of the semiconductor device, the current or voltage source comprises a photodiode.

In a further embodiment the quenching component comprises a resistor or a transistor.

In a further embodiment, the quenching component is an active quenching circuit.

A further embodiment comprises a pulse generating component electrically connected with the collector. In particular, the pulse generating component may be an inverter or a Schmitt trigger.

A further embodiment comprises a counter, a clock and a processing unit, which are connected with the pulse generating component, the counter being configured to count pulses generated by the pulse generating component, the clock being configured to provide a time normal or standard, and the processing unit being configured to generate a result of a measurement.

In a further embodiment the processing unit is configured to determine the result in digital form as a relation between a count of pulses and the time normal or standard.

A further embodiment comprises a switch or further transistor, which enables a temporary short circuit between the base and the emitter.

A further embodiment comprises at least one further bipolar transistor comprising a further collector connected with a further quenching component, the bipolar transistor and the at least one further bipolar transistor comprising different efficiencies in converting the occurrence of injected charge carriers into counts.

A further embodiment comprises switches or further transistors between the current or voltage source and the emitter and at least one further emitter, the switches enabling to connect each of the emitters separately with the current or voltage source.

A further embodiment comprises at least one further bipolar transistor comprising a further collector connected with a further quenching component, and at least one more current or voltage source, the current or voltage sources including sensors of different sensitivities.

A further embodiment comprises a substrate of semiconductor material, the substrate having a main surface. The bipolar transistor comprises a shallow well of a first type of conductivity in a deep well of an opposite second type of conductivity in the substrate, a doped region of the second type of conductivity in the shallow well at the main surface, a p-n junction between the doped region and the shallow well, a junction-forming region arranged in the deep well under the shallow well, the junction-forming region having a doping concentration for the second type of conductivity, the doping concentration of the junction-forming region being higher than a doping concentration of the deep well outside the junction-forming region, and a further p-n junction between the junction-forming region and the shallow well. The further p-n junction is configured for detecting an injection of charge-carriers by a current or voltage across the p-n junction when the further p-n junction is reverse biased above a breakdown voltage.

A further embodiment comprises a shallow well contact region of the first type of conductivity in the shallow well at the main surface, the shallow well contact region having a doping concentration that is higher than a doping concentration of the shallow well. The doped region is arranged at a distance from the shallow well contact region.

In a further embodiment the doped region and the shallow well contact region extend over at least 80% or even 90% of a portion of the main surface that is occupied by the shallow well.

A further embodiment comprises a deep well contact region of the second type of conductivity in the deep well at the main surface, the deep well contact region having a doping concentration that is higher than a doping concentration of the deep well.

A further embodiment comprises a deep well contact region of the second type of conductivity in the deep well at the main surface, the deep well contact region having a doping concentration that is higher than a doping concentration of the deep well.

A further embodiment comprises contact layers formed on the deep well contact region, the doped region and the shallow well contact region, and contact plugs arranged on the contact layers. The contact plugs may instead be arranged directly on the deep well contact region, the doped region and the shallow well contact region.

A further embodiment comprises a substrate contact region of the first type of conductivity in the substrate at the main surface, the substrate contact region having a doping concentration that is higher than a doping concentration of the substrate, and a contact plug arranged on the substrate contact region or on a contact layer that is formed on the substrate contact region.

BRIEF DESCRIPTION OF THE DRAWINGS

The following is a detailed description of examples of the semiconductor device in conjunction with the appended figures.

FIG. 5 shows a circuit diagram for single electron counting from the collector current of a bipolar transistor.

FIG. 6 shows a time-voltage diagram for the circuit of FIG. 5.

FIG. 7 shows a circuit diagram according to FIG. 5 including a switch to short-circuit the base-emitter junction.

DETAILED DESCRIPTION

Figure 1:
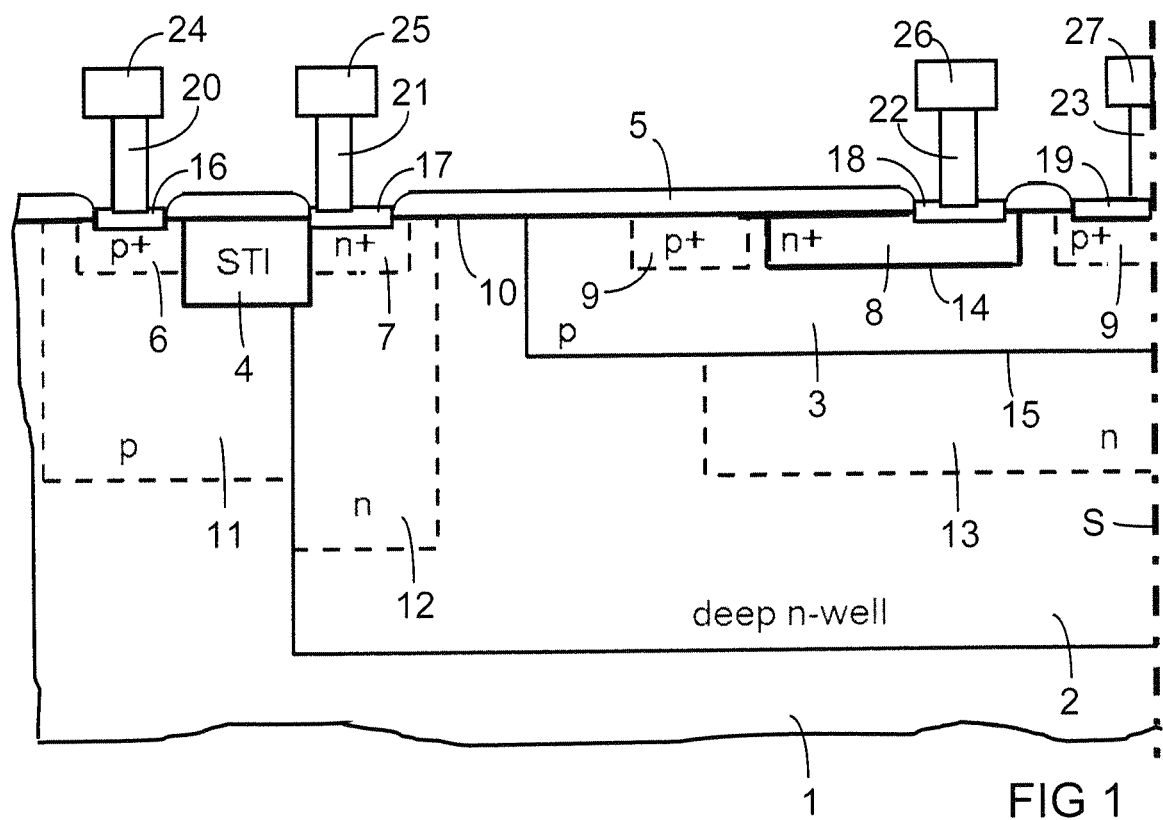
FIG. 1 is a partial cross section of a bipolar transistor.

FIG. 1 is a partial cross section of a semiconductor device comprising a bipolar transistor that is configured to be operated with a quenching component at a collector-to-base voltage exceeding the breakdown voltage. The semiconductor device comprises a substrate 1 of semiconductor material, which may be silicon, for instance.

Doped regions in the substrate 1 have a first type of conductivity or an opposite second type of conductivity. The first type of conductivity may be p-type conductivity, so that the second type of conductivity is n-type conductivity, as indicated in the figures by way of example. The types of conductivity may be reversed. Doping concentrations for either type of conductivity that are sufficiently high for the formation of ohmic contacts on the semiconductor material are respectively indicated by p+ and n+.

The substrate 1 may be intrinsically doped or have a low doping concentration for the first type of conductivity. At a main surface 10 of the substrate 1, a shallow well 3 of the first type of conductivity is located in a deep well 2 of the second type of conductivity.

An isolation region 4, which may be a shallow trench isolation, for instance, can be present where a lateral boundary of the deep well 2 reaches the main surface 10. A cover layer 5 of a dielectric material is optionally present on the main surface 10. The cover layer 5 can be an oxide of the semiconductor material, in particular silicon nitride, silicon dioxide or a combination of silicon nitride and silicon oxide, for instance.

A substrate contact region 6, which has a high doping concentration for the first type of conductivity, may be provided if an electric connection of the substrate 1 is desired. The substrate contact region 6 is formed at the main surface 10 and may be arranged in a substrate region 11, which has a doping concentration for the first type of conductivity yielding an electric conductivity that is higher than the basic conductivity of the substrate 1.

A deep well contact region 7, which has a high doping concentration for the second type of conductivity, is provided for an electric connection of the deep well 2. The deep well contact region 7 is formed at the main surface 10 and may be arranged in a well region 12, which has a doping concentration for the second type of conductivity yielding an electric conductivity that is higher than the basic conductivity of the deep well 2.

A doped region 8, which has a high doping concentration for the second type of conductivity, is arranged at the main surface 10 in the shallow well 3. A shallow well contact region 9, which has a high doping concentration for the opposite first type of conductivity, is provided for an electric connection of the shallow well 3 and is also arranged at the main surface 10 in the shallow well 3, at a small distance from the doped region 8.

A p-n junction 14 is formed between the doped region 8 and the shallow well 3. A special region, which will be referred to as junction-forming region 13, is present in the deep well 2 under the shallow well 3, where a further p-n junction 15 is formed between the junction-forming region 13 and the shallow well 3. The junction-forming region 13 has an elevated doping concentration for the second type of conductivity at least at the further p-n junction 15 and is thus suitable for an avalanche multiplication of charge carriers. In the semiconductor device shown in FIG. 1, the area of the p-n junction 14 is smaller than the area of the further p-n junction 15.

In particular, the bipolar transistor is a vertical bipolar transistor. The deep well 2 provides the collector, the shallow well 3 provides the base, and the doped region 8 provides the emitter. The deep well 2 has a region that reaches deeper into the substrate 1 than the shallow well 3. The junction-forming region 13 especially is a region of the deep well 2 that is arranged below the shallow well 3. Thus the distance of the junction-forming region 13 from the main surface 10 is larger than the distance of the shallow well 3 from the main surface 10. Hence the movement of charge carriers of an electric current through the shallow well 3 and the p-n junction 30 has a component in the direction normal to the main surface 10.

The high doping concentrations of the regions 6, 7, 8, 9 enable to form ohmic contacts between the semiconductor material and electrically conductive contact layers. In the described examples, the contact layers are provided by optional silicide layers 16, 17, 18, 19. Contact plugs 20, 21, 22, 23 may be arranged in a dielectric layer, in particular an intermetal dielectric of a wiring, for instance. Such a dielectric layer is known per se in semiconductor technology, in particular standard CMOS technology, and not shown in the figures. The contact plugs 20, 21, 22, 23 electrically connect the contact layers 16, 17, 18, 19 to respective conductor layers 24, 25, 26, 27, which may be conductor tracks in a structured metallization level of a wiring, for instance. If the silicide layers 16, 17, 18, 19 are not provided, the contact plugs 20, 21, 22, 23 can be applied directly on the regions 6, 7, 8, 9.

In the example shown in FIG. 1, the contact plug 23 and the corresponding conductor layer 27, which are provided on the shallow well contact region 9, are rotationally symmetrically arranged on an optional symmetry axis S. The contact plug 23 and the corresponding conductor layer 27 can instead be arranged at another suitable position above the shallow well contact region 9.

Figure 2:
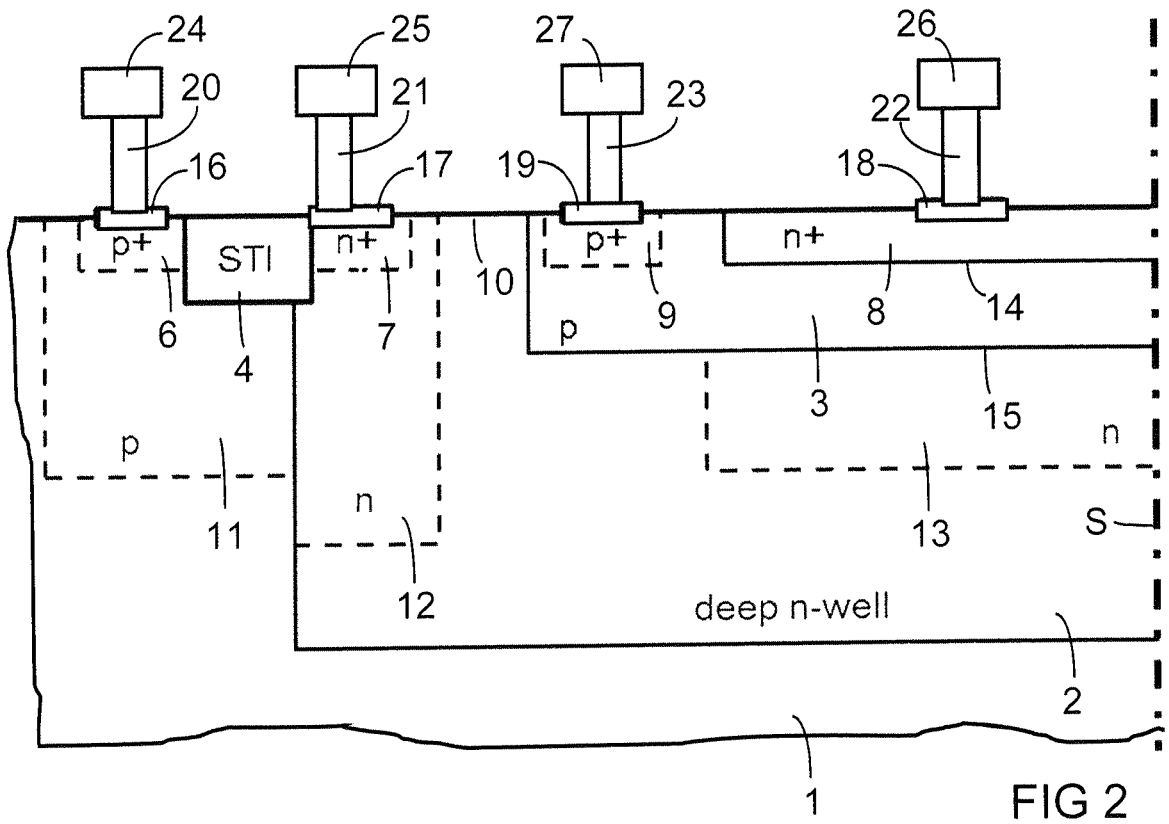
FIG. 2 is a partial cross section of a further bipolar transistor with a different arrangement of a doped region.

FIG. 2 is a partial cross section of a further semiconductor device with a bipolar transistor, in which the doped region 8 occupies a larger area. Elements of the semiconductor device according to FIG. 2 corresponding to elements of the semiconductor device according to FIG. 1 are designated with the same reference numerals. In the semiconductor device according to FIG. 2, the doped region 8 is larger than the doped region 8 of the semiconductor device according to FIG. 1. The doped region 8 may especially be arranged around an optional symmetry axis S. As in the semiconductor device according to FIG. 1, the area of the p-n junction 14 is smaller than the area of the further p-n junction 15. In particular, the bipolar transistor is a vertical bipolar transistor, as described above in conjunction with FIG. 1.

In the semiconductor device shown in FIG. 2, the arrangement of the contact layer 19 and the contact plug 23, which are provided for the electric connection of the shallow well contact region 9, is different from the arrangement of the contact layer 19 and the contact plug 23 shown in FIG. 1. In the embodiment according to FIG. 2, the contact layer 19 and the contact plug 23 are not arranged on the symmetry axis S.

Figure 3:
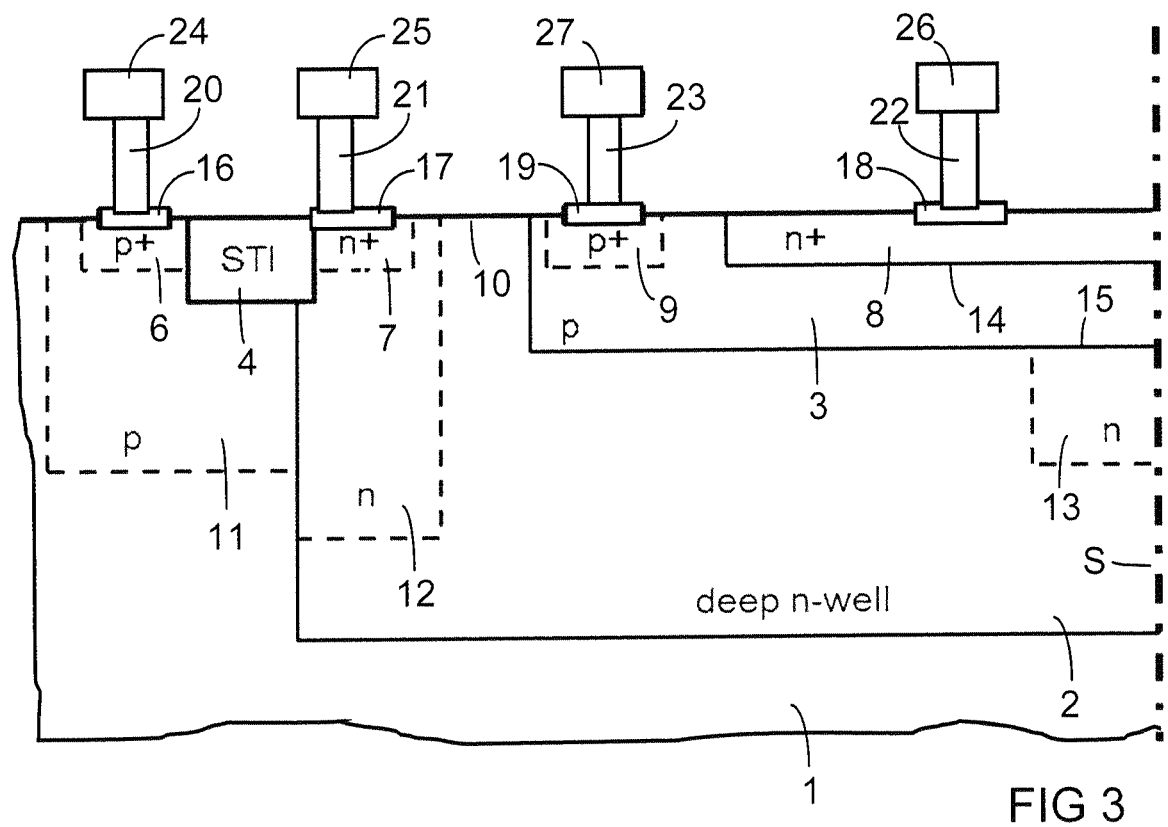
FIG. 3 is a partial cross section of a further bipolar transistor with a different arrangement of a junction-forming region.

FIG. 3 is a partial cross section of a further semiconductor device with a bipolar transistor, in which the junction-forming region 13 occupies a smaller area. Elements of the semiconductor device according to FIG. 3 corresponding to elements of the semiconductor device according to FIG. 2 are designated with the same reference numerals. In the semiconductor device according to FIG. 3, the junction-forming region 13 is smaller than the junction-forming region 13 of the semiconductor device according to FIG. 2 and may in particular be confined to a small area around the optional symmetry axis S. In particular, the bipolar transistor is a vertical bipolar transistor, as described above in conjunction with FIG. 1.

In the semiconductor device shown in FIG. 3, the area of the p-n junction 14 is larger than the area of the further p-n junction 15. The structure of the semiconductor device according to FIG. 3 exhibits a lower current-to-counts conversion efficiency compared to the semiconductor device according to FIG. 2.

Figure 4:
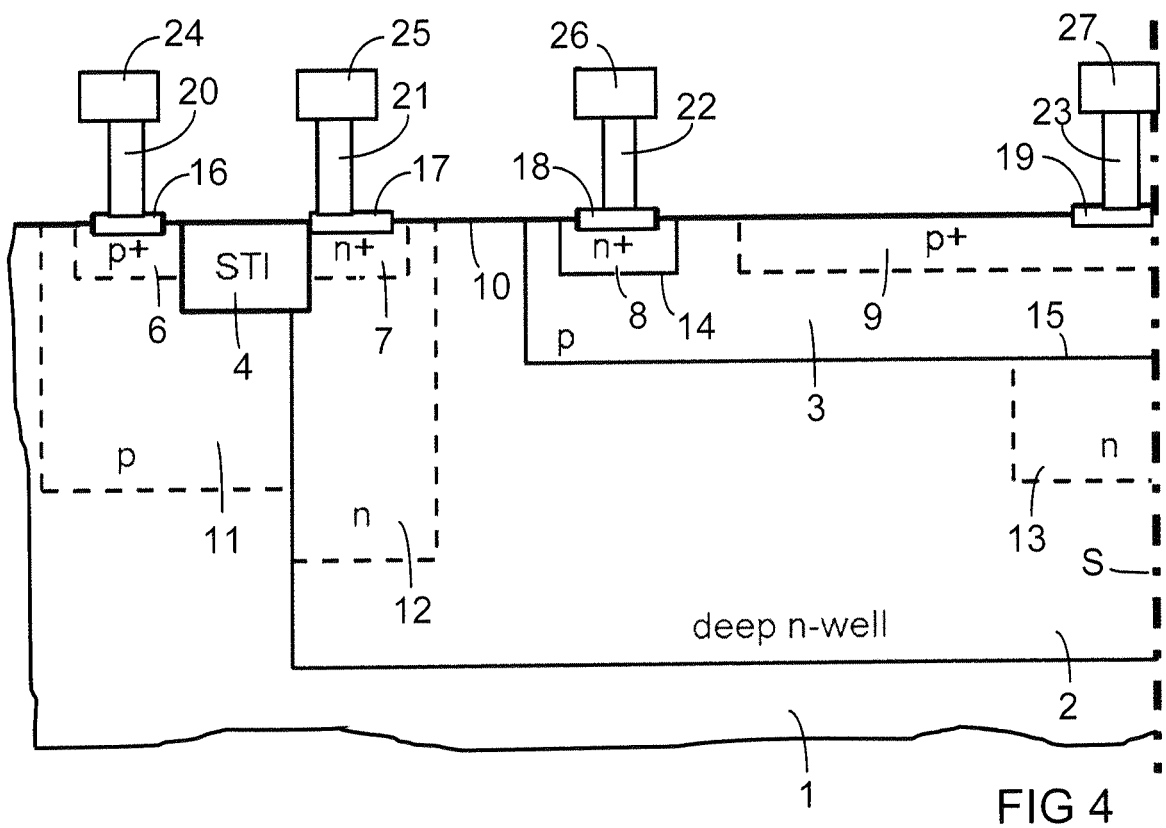
FIG. 4 is a partial cross section of a further bipolar transistor with an interchanged arrangement of regions.

FIG. 4 is a partial cross section of a further semiconductor device with a bipolar transistor. Elements of the semiconductor device according to FIG. 4 corresponding to elements of the semiconductor device according to FIG. 3 are designated with the same reference numerals. In the semiconductor device according to FIG. 4, the positions of the doped region 8 and the shallow well contact region 9 are exchanged compared with the semiconductor device according to FIG. 3. Thus the p-n junction 14 and the further p-n junction 15 are laterally shifted with respect to one another and do not overlap. The structure of the semiconductor device according to FIG. 4 also exhibits a lower current-to-counts conversion efficiency compared to the semiconductor device according to FIG. 2. In particular, the bipolar transistor is a vertical bipolar transistor, as described above in conjunction with FIG. 1. In the example of FIG. 4, any movement of charge carriers of an electric current between the doped region 8 and the junction-forming region 13 has a further component in the direction parallel to the substrate surface 10.

FIG. 5 shows a circuit diagram for a semiconductor device that enables single electron counting of the collector current of a bipolar transistor. The semiconductor device comprises a bipolar transistor T that is configured to be operated at a collector-to-base voltage $V_{CB}$ exceeding the breakdown voltage BV of the base-collector junction, according to the above description. The bipolar transistor T may in particular be a bipolar transistor according to one of the FIGS. 1 to 4. The collector is formed by the deep well 2, the contact layer 17 and the contact plug 21, the emitter is formed by the doped region 8, the contact layer 18 and the contact plug 22, and the base is formed by the shallow well 3, the contact layer 19 and the contact plug 23. The p-n junction 14 is the base-emitter junction, and the further p-n junction 15 is the collector-base junction.

A semiconductor device with single electron counting capability is intended to produce a single pulse for every single event. It should not give spurious pulses and should quickly recover to a state in which it is ready for the next count. Some form of quenching is required to inhibit a prolonged avalanche and to reduce the time during which the device is not ready to detect new events. FIG. 5 shows a quenching component 28 connected between the collector C and a high voltage $V_{HV}$. The quenching component 28 may be a resistor or a transistor, for instance, or an active quenching circuit. The active quenching circuit Q, which is connected between the collector C of the bipolar transistor T and the high voltage $V_{HV}$, allows to reduce the resistance to $V_{HV}$ during the recharge of the base-collector junction, and thus to obtain a shorter recharging time. Circuits that are suitable for active quenching are known per se and need not be described here.

The inverter 29 generates digital pulses, which can be further processed. The inverter 29 and subsequent circuits operate between a high voltage $V_{HV}$ and a low voltage $V_N$, which may typically satisfy the relation $1\,V<V_{HV}V_N<6\,V$. A Schmitt trigger or other appropriate circuit components may instead be used to generate digital pulses. The pulses are counted with a counter, a clock is provided, and a processing unit is applied to relate the count of pulses to a time interval or time unit provided by the clock in order to generate the result of the measurement in digital form.

A current source 30 generates the emitter current, which is the analog signal that is to be measured. Alternatively, a voltage source 31 can be used. The current or voltage source 30, 31 may be any type of sensor that generates a current or a voltage, in particular a photodiode 32, for instance. FIG. 6 shows a time-voltage diagram for the circuit of FIG. 5. The difference $V_{out}-V_N$ between the output voltage $V_{out}$ of the inverter 29 and the low voltage $V_N$ is shown as a function of the time. The temporal variation of the output voltage $V_{out}$ generated by the inverter 29 yields a sequence of digital pulses.

FIG. 7 shows a further circuit diagram for a semiconductor device that enables single electron counting of the collector current of a bipolar transistor. The circuit comprises a bipolar transistor T that is configured to be operated at a reverse collector-to-base voltage exceeding the breakdown voltage, according to the above description. The bipolar transistor T may in particular be a bipolar transistor according to one of the FIGS. 1 to 4. Components of the circuit diagram shown in FIG. 7 that correspond to components of the circuit diagram shown in FIG. 5 are designated with the same reference numerals.

In the circuit according to the diagram shown in FIG. 7, a switch 33 or further transistor allows to short-circuit the base-emitter junction, thus enabling a measurement of dark count events. The result of the regular measurement, which employs the current source 30 or an alternative component when the switch 33 or further transistor is open, can be adjusted by subtracting the dark count events. Instead of using the switch 33, a second bipolar transistor, which has a permanent electrical connection between base and emitter, may be employed to measure the dark count events, so that this measurement and the regular measurement can be performed simultaneously.

Figure 8:
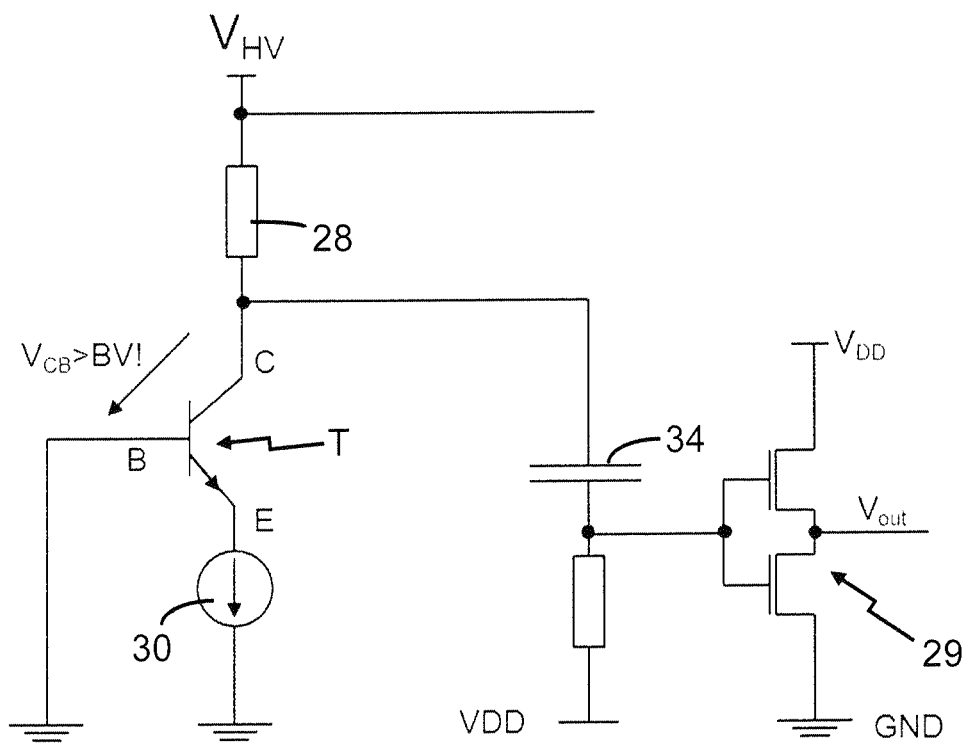
FIG. 8 shows a further circuit diagram for single electron counting from the collector current of a bipolar transistor.

FIG. 8 shows a further circuit diagram for a semiconductor device that enables single electron counting of the collector current of a bipolar transistor. The circuit comprises a bipolar transistor T that is configured to be operated at a reverse collector-to-base voltage exceeding the breakdown voltage, according to the above description. The bipolar transistor T may in particular be a bipolar transistor according to one of the FIGS. 1 to 4. Components of the circuit diagram shown in FIG. 8 that correspond to components of the circuit diagram shown in FIG. 5 are designated with the same reference numerals.

The capacitor 34 of the circuit diagram shown in FIG. 8 allows to operate the inverter 29 and subsequent circuits at a low voltage, which may especially be the difference between a standard supply voltage $V_{DD}$ of CMOS transistor devices and ground GND. $V_{DD}$ is typically in the range from 1 V to 6 V. This has the advantage that for communication with the outside world the typical I/O voltages are available and no level shifters need to be used.

Figure 9:
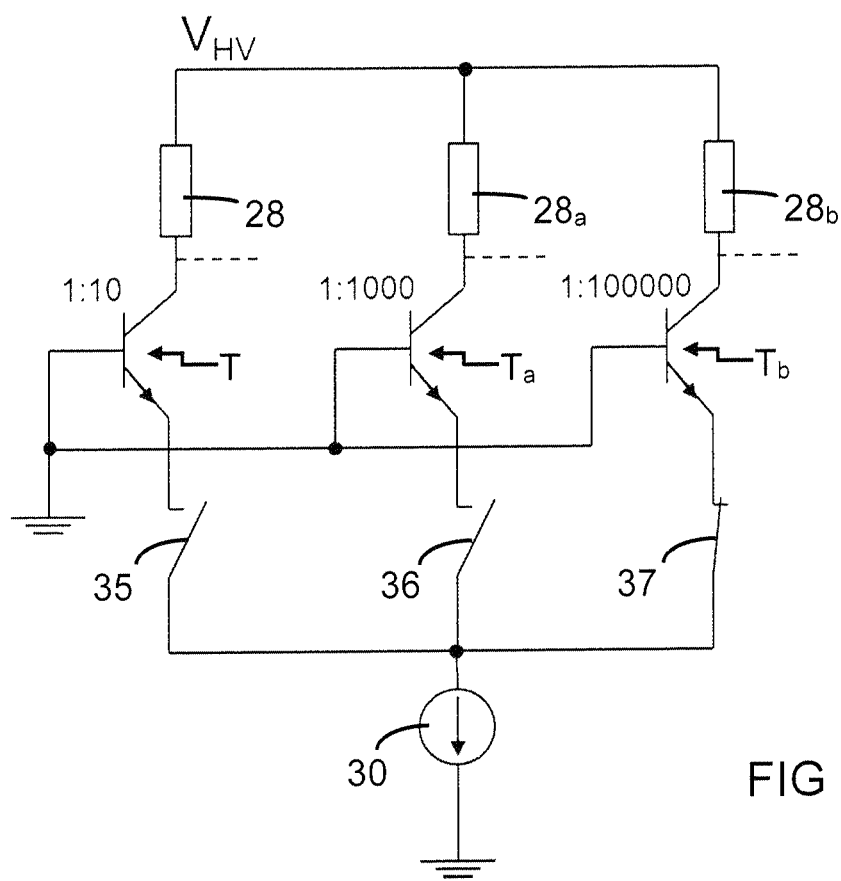
FIG. 9 shows a circuit diagram providing larger dynamic range of the analog-to-digital conversion.

FIG. 9 shows a diagram of a circuit for enlarging the dynamic range of the analog-to-digital conversion. This circuit comprises more than one bipolar transistor that is configured to be operated at a collector-to-base voltage exceeding the breakdown voltage, according to the above description. FIG. 9 shows three such bipolar transistors T, $T_a$, $T_b$, by way of example, but the number is arbitrary. The bipolar transistors T, $T_a$, $T_b$ can be applied as individual devices or integrated in the same semiconductor chip as components of the circuit. Each of the bipolar transistors T, $T_a$, $T_b$ may particularly be a bipolar transistor according to one of the FIGS. 1 to 4. The bipolar transistors are configured so that they differ in their efficiency in converting the occurrence of injected electrons into counts. Depending on the signal strength, the appropriate bipolar transistor is enabled by the corresponding one of the switches 35, 36, 37 or further transistors, while the other switches or further transistors are open. Each of the bipolar transistors T, $T_a$, $T_b$ is optionally provided with a quenching component 28, $28_a$, $28_b$.

Figure 10:
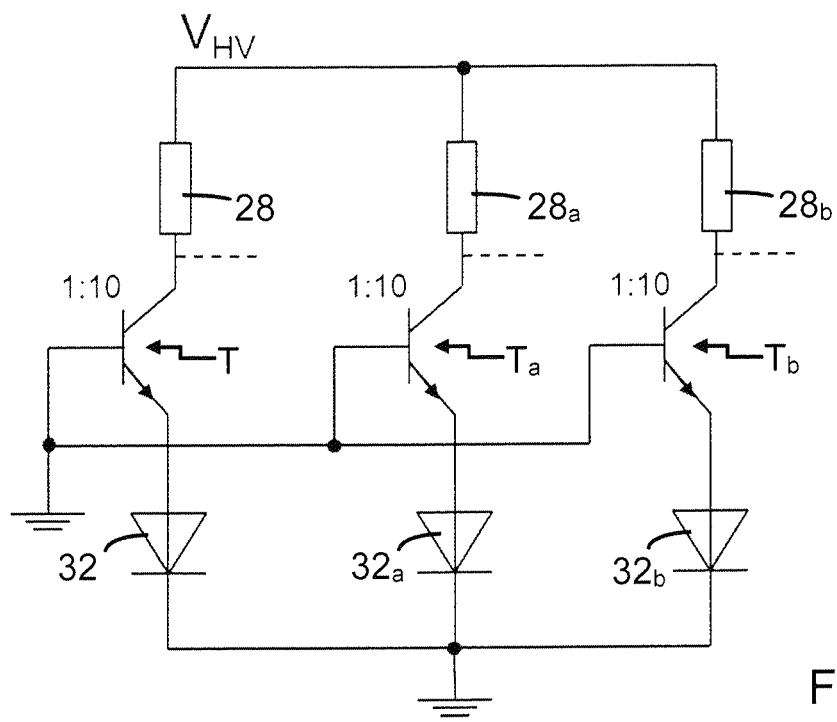
FIG. 10 shows a further circuit diagram providing larger dynamic range of the analog-to-digital conversion.

FIG. 10 shows a further diagram of a circuit for enlarging the dynamic range of the analog-to-digital conversion. The circuit comprises more than one bipolar transistor that is configured to be operated at a collector-to-base voltage exceeding the breakdown voltage, according to the above description. FIG. 10 shows three such bipolar transistors T, $T_a$, $T_b$, by way of example, but the number is arbitrary. The bipolar transistors T, $T_a$, $T_b$ can be applied as individual devices or integrated in the same semiconductor chip as components of the circuit. Each of the bipolar transistors T, $T_a$, $T_b$ may particularly be a bipolar transistor according to one of the FIGS. 1 to 4. The bipolar transistors are configured to have the same efficiency in converting the occurrence of injected electrons into counts, but the current source is varied.

In the circuit according to FIG. 10, each of the bipolar transistors T, $T_a$, $T_b$ is provided with a dedicated current or voltage source. These current or voltage sources comprise sensors of different sensitivities. If photodiodes 32, $32_a$, $32_b$ are used as current sources, as shown in FIG. 10 by way of example, the photodiodes 32, $32_a$, $32_b$ are configured to have different sensitivities. This may be achieved by varying the active areas of the photodiodes, which may typically differ by factors of 100 and 10000, for instance. The active area of the first photodiode 32 may be typically 40000 µm², the active area of the second photodiode $32_a$ typically 400 µm², and the active area of the third photodiode $32_b$ typically 4 µm², for example.

In a further circuit for enlarging the dynamic range of the analog-to-digital conversion, both the efficiencies of the bipolar transistors and the sensitivities of the sensors providing the current or voltage source can be varied. In particular, such a circuit can be obtained by a combination of components of the circuits according to FIGS. 9 and 10.

Figure 11:
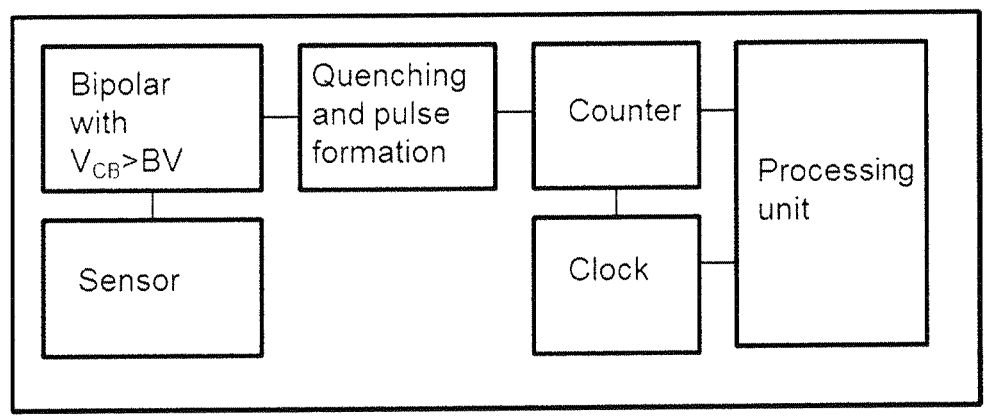
FIG. 11 shows a block diagram for a measurement system.

FIG. 11 shows a block diagram for a measurement system. An analog signal generated by a sensor is applied to a bipolar transistor in a circuit for quenching and pulse formation. The bipolar transistor is operated at a reverse collector-to-base voltage $V_{CB}$ that is higher than the breakdown voltage BV of the base-collector junction. The analog signal is thus converted to a sequence of digital pulses, which are counted. The result obtained by the counter can be further processed in a clocked processing unit.

In the described semiconductor device, the base-collector junction is operated above the breakdown voltage in a manner that is similar to the operation of a single-photon avalanche diode. Combined with the appropriate electronic circuit components (quencher, counter, clock, processing unit) the number of electrons passing the base-collector junction (=collector current) can be counted. Hence very small currents can be measured and the result is directly digital (=counted number of electrons).

An emitter current of 1 pA corresponds to $6.24 \cdot 10^6$ electrons per second. As in a single-photon avalanche diode, not every electron or hole generates an avalanche pulse. The probability for a carrier traversing the high electric field to generate an avalanche is in the order of 10% to 90% and is mainly impacted by the carrier type (electrons or holes) and the electric field, which depends on the design of the junction and the excess bias voltage. Even with a trigger probability of 10%, a current of 1 pA results in a count rate of $6 \cdot 10^5$ counts per second.

With the exception of the quenching component, all components of the described semiconductor device are digital. This is a further advantage that is obtained by using the described semiconductor device.

The invention claimed is:

1. A semiconductor device with single electron counting capability, comprising:
    a substrate of semiconductor material, the substrate having a main surface,
    a bipolar transistor with emitter, base and collector, comprising:
        a shallow well of a first type of conductivity in a deep well of an opposite second type of conductivity in the substrate,
        a doped region of the second type of conductivity in the shallow well at the main surface, and
        a p-n junction between the doped region and the shallow well,
    a collector-to-base breakdown voltage,
    a current or voltage source electrically connected with the emitter,
    a quenching component electrically connected with the collector, the bipolar transistor being configured for operation at a reverse collector-to-base voltage above the breakdown voltage,
    a junction-forming region arranged in the deep well under the shallow well, the junction-forming region having a doping concentration for the second type of conductivity, the doping concentration of the junction-forming region being higher than a doping concentration of the deep well outside the junction-forming region, and
    a further p-n junction between the junction-forming region and the shallow well.

2. The semiconductor device of claim 1, wherein the current or voltage source comprises a photodiode.

3. The semiconductor device of claim 1, wherein the quenching component is an active quenching circuit.

4. The semiconductor device according to claim 1, further comprising:
a pulse generating component electrically connected with the collector.

5. The semiconductor device according to claim 4, wherein the pulse generating component is an inverter or a Schmitt trigger.

6. The semiconductor device according to claim 4, further comprising:
a counter, a clock and a processing unit, which are connected with the pulse generating component,
the counter being configured to count pulses generated by the pulse generating component,
the clock being configured to provide a time normal or standard, and the processing unit being configured to generate a result of a measurement.

7. The semiconductor device according to claim 6, wherein
the processing unit is configured to determine the result in digital form as a relation between a count of pulses and the time normal or standard.

8. The semiconductor device according to claim 1, further comprising:
a switch or further transistor, which enables to short-circuit the base and the emitter.

9. The semiconductor device according to claim 1, further comprising:
at least one further bipolar transistor comprising a further collector connected with a further quenching component, the bipolar transistor and the at least one further bipolar transistor comprising different efficiencies in converting an occurrence of injected charge carriers into counts.

10. The semiconductor device of claim 9, further comprising:
switches or further transistors between the current or voltage source and the emitter and at least one further emitter, the switches or further transistors enabling to connect each of the emitters separately with the current or voltage source.

11. The semiconductor device according to claim 1, further comprising:
at least one further bipolar transistor comprising a further collector connected with a further quenching component, and
at least one more current or voltage source, the current or voltage sources including sensors of different sensitivities.

12. The semiconductor device of claim 1, further comprising:
a shallow well contact region of the first type of conductivity in the shallow well at the main surface,
the shallow well contact region having a doping concentration that is higher than a doping concentration of the shallow well, and
the doped region being arranged at a distance from the shallow well contact region.

13. The semiconductor device of claim 1, further comprising:
a deep well contact region of the second type of conductivity in the deep well at the main surface, the deep well contact region having a doping concentration that is higher than a doping concentration of the deep well.

14. The semiconductor device of claim 3, wherein the quenching circuit comprises a resistor or a transistor.

* * * * *